(12) United States Patent
Forbes et al.

(10) Patent No.: US 7,772,635 B2
(45) Date of Patent: Aug. 10, 2010

(54) NON-VOLATILE MEMORY DEVICE WITH TENSILE STRAINED SILICON LAYER

(75) Inventors: Leonard Forbes, Corvallis, OR (US); Kie Y. Ahn, Chappaqua, NY (US); Alan R. Reinberg, Cheshire, CT (US)

(73) Assignee: Micron Technology, Inc., Boise, ID (US)

( * ) Notice: Subject to any disclaimer, the term of this patent is extended or adjusted under 35 U.S.C. 154(b) by 911 days.

(21) Appl. No.: 11/260,339

(22) Filed: Oct. 27, 2005

(65) Prior Publication Data
US 2007/0096193 A1    May 3, 2007

(51) Int. Cl.
H01L 23/62 (2006.01)
(52) U.S. Cl. .................. 257/314; 257/312; 257/322; 257/324
(58) Field of Classification Search ............... 257/321, 257/314, 322, 324
See application file for complete search history.

(56) References Cited

U.S. PATENT DOCUMENTS

| | | | |
|---|---|---|---|
| 5,098,515 A | | 3/1992 | Kashida et al. |
| 5,467,308 A | * | 11/1995 | Chang et al. ............ 365/185.01 |
| 5,759,898 A | | 6/1998 | Ek et al. |
| 6,313,486 B1 | * | 11/2001 | Kencke et al. ............. 257/192 |
| 6,703,648 B1 | | 3/2004 | Xiang et al. |
| 6,787,423 B1 | | 9/2004 | Xiang |
| 6,869,897 B2 | | 3/2005 | Takenaka |
| 6,881,635 B1 | | 4/2005 | Chidambarrao et al. |
| 6,900,143 B1 | | 5/2005 | Pan et al. |
| 6,902,965 B2 | | 6/2005 | Ge et al. |
| 6,911,379 B2 | | 6/2005 | Yeo et al. |
| 6,943,087 B1 | | 9/2005 | Xiang et al. |
| 6,953,972 B2 | | 10/2005 | Yeo et al. |
| 6,955,952 B2 | | 10/2005 | Yeo et al. |
| 7,115,954 B2 | * | 10/2006 | Shimizu et al. ............. 257/369 |
| 2005/0212065 A1 | | 9/2005 | Forbes |
| 2005/0247972 A1 | | 11/2005 | Forbes |
| 2008/0001178 A1 | * | 1/2008 | Gehring et al. ............. 257/213 |

OTHER PUBLICATIONS

Ghani et al., 2003, IEEE, pp. 11.6.1-11.6.3, "A 90nm High Volume Manufacturing Logic Technology Featuring Novel 45nm Gate Length Strained Silicon CMOS Transistors".
Goto et al., 2004, IEEE, "Technology Booster using Strain-Enhancing Laminated SiN (SELS) for 65nm Node HP MPUs".

(Continued)

*Primary Examiner*—Howard Weiss
*Assistant Examiner*—Steven H Rao
(74) *Attorney, Agent, or Firm*—Leffert Jay & Polglaze, P.A.

(57) ABSTRACT

A non-volatile memory device has improved performance from a stressed, silicon nitride capping layer. The device is comprised of memory cells in a substrate that have source and drain regions. A tunnel dielectric is formed over the substrate between each pair of source and drain regions. If the memory device is an NROM, a nitride charge storage layer is formed over the tunnel dielectric. If the memory device is a flash memory, a floating gate is formed over the tunnel dielectric. An inter-gate insulator and control gate are then formed over the charge storage layer. The stressed, silicon nitride capping layer is formed over the control gate.

26 Claims, 6 Drawing Sheets

OTHER PUBLICATIONS

Komoda et al, 2004, IEEE, "Mobility Improvement for 45nm Node by Combination of Optimized Stress Control and Channel Orientation Design".

Pidin et al, 2004, IEEE, "A Novel Strain Enhanced CMOS Architecture Using Selectively Deposited High Tensile and High Compressive Silicon Nitride Films".

Alan R. Reinberg, 1979, Ann. Rev. Mater. Sci., pp. 341-372, "Plasma Deposition of Inorganic Thin Films".

Alan R. Reinberg, May 1979, Journal of Electronic Materials, abstract: "Plasma Deposition of Inorganic Silicon Containing Films".

Alan R. Reinberg, Mar. 1974, Journal of Electrochemical Society, abstract: "RF Plasma Deposition of Inorganic Films for Semiconductor Application".

Singer, 2005, pp. 1-2, "Dual Line Stresses NMOS and PMOS", Semiconductor International.

Subbanna et al., 2005, IEEE, pp. 195-196, "High Performance Silicon Germanium Technology".

* cited by examiner

US 7,772,635 B2

NON-VOLATILE MEMORY DEVICE WITH TENSILE STRAINED SILICON LAYER

TECHNICAL FIELD OF THE INVENTION

The present invention relates generally to memory devices and in particular the present invention relates to non-volatile memory cells.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance of flash memory transistors needs to increase as the performance of computer systems increases. To accomplish a performance increase, the transistors can be reduced in size. This has the effect of increased speed with decreased power requirements.

However, a problem with decreased flash memory size is that flash memory cell technologies have some scaling limitations due to the high voltage requirements for program and erase operations. As MOSFETs are scaled to deep sub-micron dimensions, it becomes more difficult to maintain an acceptable aspect ratio. Not only is the gate oxide thickness scaled to less than 10 nm as the channel length becomes sub-micron but the depletion region width and junction depth must be scaled to smaller dimensions.

For the reasons stated above, and for other reasons stated below which will become apparent to those skilled in the art upon reading and understanding the present specification, there is a need in the art for a higher performance flash memory cell.

SUMMARY

The above-mentioned problems with performance, scalability, and other problems are addressed by the present invention and will be understood by reading and studying the following specification.

The present invention encompasses a non-volatile memory cell with a tensile strained silicon layer. The cell is fabricated in a substrate that has a pair of doped source/drain regions. A tunnel dielectric is formed over the substrate and substantially between the pair of source/drain regions. A charge storage gate is formed over the tunnel dielectric. The charge storage gate may be a polysilicon floating gate or an NROM nitride charge storage layer.

An inter-gate dielectric is formed over the charge storage gate. A control gate is formed over the inter-gate dielectric. The stressed silicon nitride layer is formed over the control gate. In one embodiment, this is a uniaxial layer.

Further embodiments of the invention include methods and apparatus of varying scope.

DETAILED DESCRIPTION

Figure 1:
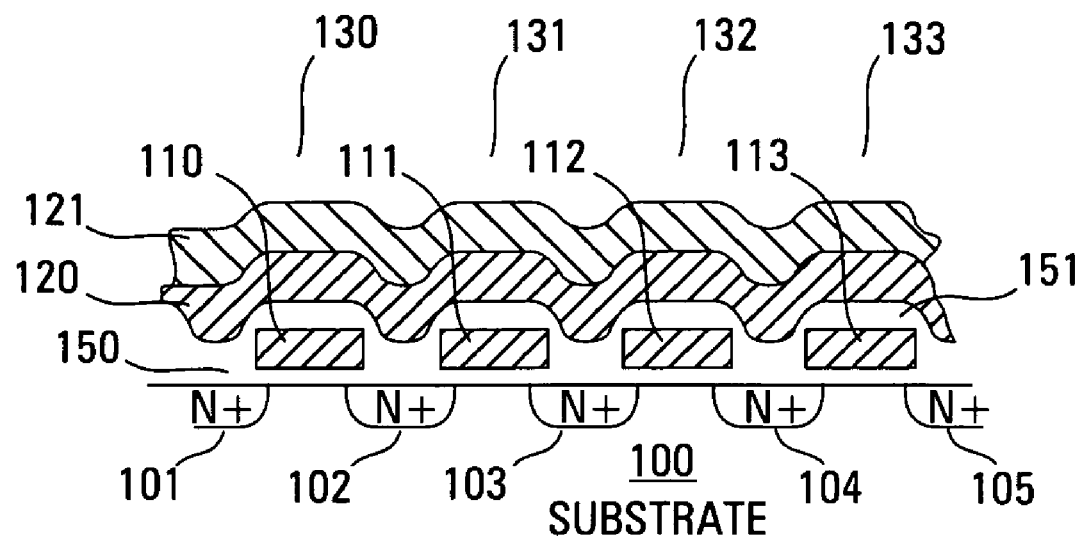
FIG. 1 shows a cross-sectional view of one embodiment of a portion of a NAND architecture flash memory array of the present invention using a strained silicon layer.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 illustrates a cross-sectional view of one embodiment of a portion of a planar, NAND flash memory cell array of the present invention. The illustrated array is comprised of a silicon or a silicon-on-insulator substrate 100. Each memory cell 130-133 is comprised of two n+ regions 101-105 that are doped (e.g., implanted) into the substrate 100 and act as source/drain regions for each cell 130-133. The function of each region 101-105 is determined by the direction of operation of the memory cell. In other words, for the left most memory cell 130, the n+ regions 101, 102 for that cell 130 can act as a source 101 and drain 102 under a first set of biasing conditions and as a drain 101 and source 102 under a second set of biasing conditions. The n+ regions are coupled to the bit lines and source lines of the memory array as will be discussed subsequently with reference to the schematic diagram of FIG. 3.

In the embodiment of FIG. 1, the substrate 100 is a p-type material and the source/drain regions 101-105 are doped n+. However, alternate embodiments may have a n-type substrate 100 with p-type source/drain regions 101-105.

A tunnel dielectric layer 150 is formed between the substrate 100 and each of the floating gates 110-113. This layer 150 is comprised of an insulator material, such as an oxide (e.g., silicon dioxide), in order to isolate the floating gates 110-113 from the substrate 100. In one embodiment, the floating gates 110-113 are comprised of polysilicon. The floating gate 110-113 acts as a charge storage layer for storing electrons that are injected from the channel between the source/drain regions 101-105 during a programming operation.

In an alternate embodiment, the floating gates 110-113 can be replaced by a nitride (e.g., silicon nitride) charge storage layer 110-113 to form a nitride read only memory (NROM) device. The nitride charge storage layer 110-113 performs substantially the same task as the floating gate. However, a nitride charge storage layer 110-113 is capable of storing two or more pockets of charge that can be programmed and erased independently. The biasing and, therefore, the direction of operation of each NROM cell determines which bit is being programmed/erased.

An inter-gate dielectric layer 151 is formed over the floating gates/nitride charges storage layers 110-113. The inter-gate dielectric layer 151, in one embodiment, is comprised of the same insulating material as the tunnel dielectric (e.g., silicon dioxide). Alternate embodiments can use other insulating materials.

The control gate layer 120 is formed over the inter-gate dielectric layer 151. Since this is a NAND architecture memory array, the control gates of adjacent cells 130-133 in a row are coupled serially into a word line, as will be discussed subsequently with reference to the schematic diagram of FIG. 3. In one embodiment, the control gates 120 are comprised of polysilicon. Alternate embodiments can use other materials.

A strained silicon nitride capping layer 121 is formed over the control gate layer 120. The silicon nitride 121 is highly stressed when formed in contact with the silicon control gate layer 120. This introduces tensile stress in both flash memory cells and NROM cells.

Strained silicon nitride can be deposited by reactive plasma deposition. Using lower power during the deposition results in films not stoichiometric but which are silicon rich, have a lower density, and are under tensile stress. Deposition of these films on silicon wafers causes tensile stress in the silicon that strains the silicon changing, changing the band structure and improving electron mobility. The strain makes NMOS memory cells work better by enabling electrical charges, such as electrons, to pass more easily through the silicon lattice of the gate channel. When the nitride-crystal lattice is undistorted, it offers obstacles (i.e., energy variations) that impedes an electron's motions. The strained silicon provides the electrons with a smoother pathway.

In the strained silicon, electrons experience less resistance and increased mobility without having to shrink the size of the transistor. This results in faster memory devices with lower electric fields and drain voltages thus improving channel hot electron efficiency. The enhanced electron mobility results in improved speed performance during read operations, improved data access times, and higher drain current for a given device dimension resulting in faster switching speeds.

Two typical types of strain are biaxial strain (i.e., along two perpendicular crystallographic directions) and uniaxial strain (i.e., along one crystallographic direction) or biaxial. Biaxial strain is created by growing high-quality layers of strained material across entire wafers. The uniaxial strain selectively strains parts of individual transistors or individual transistors of an array. Using this localized effect, either tensile or compressive strain can be imposed on both N-type and P-type transistors on the same chip.

Strain influences each type of electrical charge in NMOS memory cells differently. Tensile strain, in which the interatomic distances in the silicon crystal are stretched, typically increases the mobility of electrons thus making N-type transistors faster. But tensile strain may not benefit P-type devices as much and it may even slow them down. Compressive strain, in which those interatomic distances are shortened, increases hole mobility.

In one embodiment, the stressed silicon nitride capping layer 121 of the present invention is formed by a reactive plasma deposition (RPD) process. RPD of silicon nitride is substantially similar to chemical vapor deposition since it combines silicon-containing gas with a nitriding agent. Thus silicon nitrides can be formed from $SiH_4$ plus $N_2$ as well as from other sources of nitrogen. A decrease in film thickness and possible rearrangement and out-gassing of hydrogen can increase mechanical stress and cause films to crack or buckle.

In the present embodiment, the nitride films are deposited over the individual NMOS transistor flash memory cells or over the rows of cells in order to cause tensile strain in the transistor channel. To avoid cracking and to introduce maximum stress, multiple thick films of silicon nitride can be deposited at low temperatures.

The RPD method of forming the stressed silicon nitride layer is for purposes of illustration only. This layer can be formed using alternate fabrication techniques.

Figure 2:
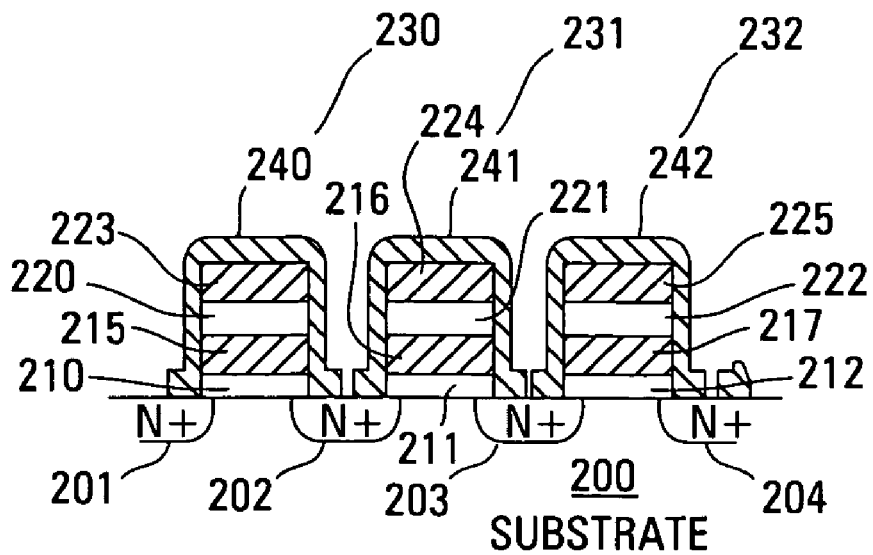
FIG. 2 shows a cross-sectional view of one embodiment of a portion of a NOR architecture flash memory array of the present invention using a strained silicon layer.

FIG. 2 illustrates a cross-sectional view of one embodiment of a portion of a NOR architecture flash memory array using a strained silicon nitride capping layer of the present invention. This embodiment is comprised of the source/drain regions 201-204 that are doped into the substrate 200. In one embodiment, these regions are n+ regions in a p-type substrate. The connection of the n+ regions to the bit lines and source lines of the memory array is discussed subsequently with reference to FIG. 4.

A tunnel insulator layer 210-212 for each memory cell 230-232 is formed over the substrate 200 and substantially between each pair of source and drain regions 201, 202 and 202, 203, and 203, 204 respectively. As in the previous embodiments, the function of each n+ region may depend upon the biasing of the transistor 230-232 and, therefore, the direction of operation.

In one embodiment, the tunnel insulator 210-212 is an oxide. Alternate embodiments may use other insulating materials.

The floating gate layer 215-217 is formed over the tunnel insulator 210-212. This layer can be comprised of polysilicon or some other floating gate material. In an alternate embodiment, the floating gate 215-217 is replaced with a nitride charge storage layer 215-217 such that an NROM device is formed.

An inter-gate insulator 220-222 is formed over the floating gate/charge storage layer 215-217. This layer 220-222 may be an oxide, such as silicon dioxide, or some other insulator.

The control gate 223-225 is formed over the inter-gate insulator layer 220-222. In one embodiment, the control gates 223-225 are comprised of polysilicon. These gates are coupled to the word lines of the NOR memory array as will be discussed subsequently with reference to FIG. 4.

The stressed silicon nitride capping layer 240-242 for each cell 230-231 is formed over the silicon control gates 223-225. In one embodiment, this layer 240-242 is formed using RPD. Alternate embodiments use other techniques for fabricating this layer.

Figure 3:
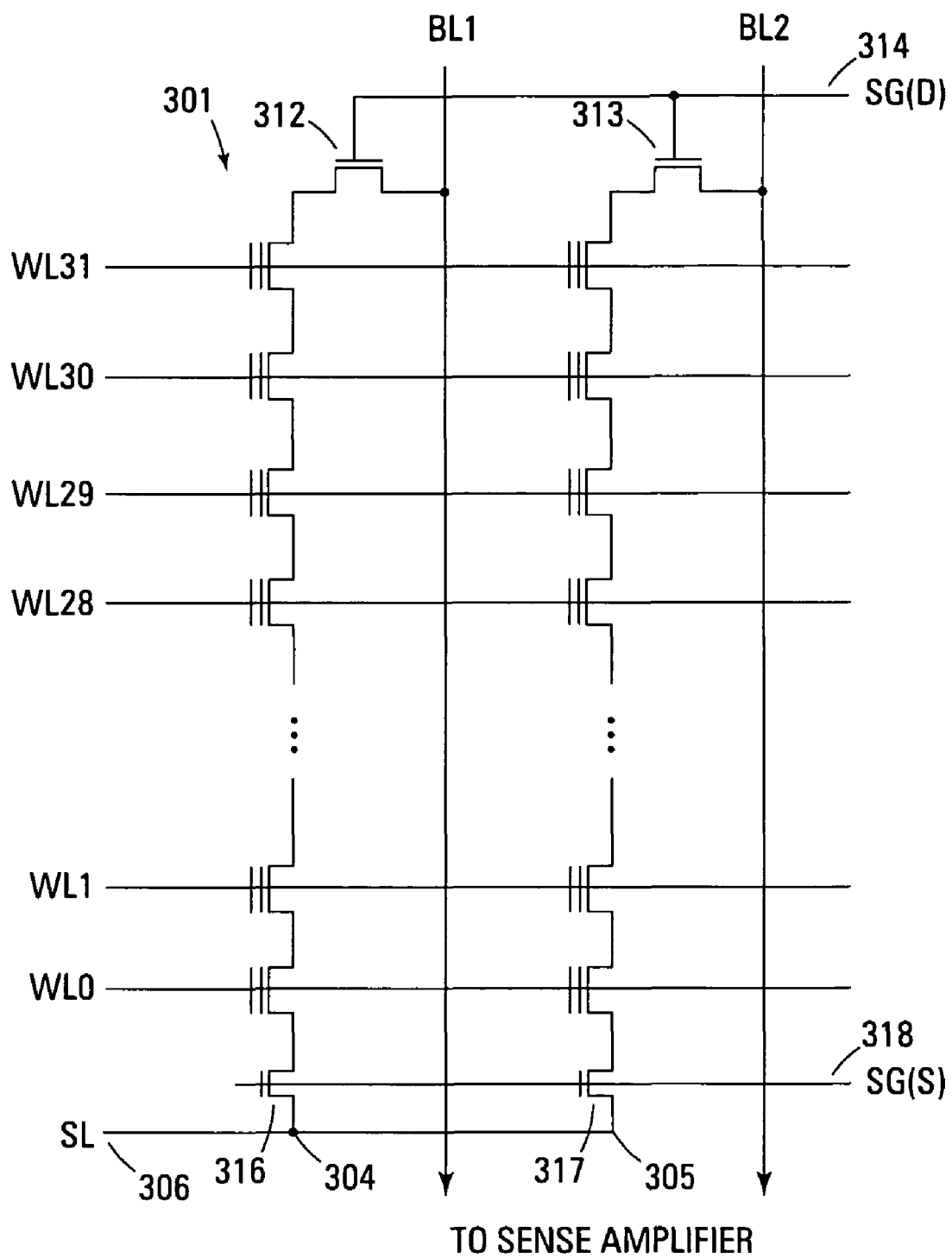
FIG. 3 shows an electrical schematic diagram of a portion of one embodiment of a NAND flash memory array incorporating the memory cells in accordance with FIG. 1.

FIG. 3 illustrates a one embodiment of a NAND architecture flash memory array incorporating the flash memory devices in accordance with the embodiment of FIG. 1. The memory array of FIG. 3, for purposes of clarity, does not show all of the elements typically required in a memory array. For example, only two bit lines are shown (BL1 and BL2) when the number of bit lines required actually depends upon the memory density. The bit lines are subsequently referred to as (BL1-BLN).

The array is comprised of an array of floating gate cells 301 arranged in series columns 304, 305. Each of the floating gate cells 301 are coupled drain to source in each series chain 304, 305. A word line (WL0-WL31) that spans across multiple series strings 304, 305 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series chain 304, 305 to be written to or read from and operate the remaining floating gate memory cells in each series string 304, 305 in a pass through mode. Each series string 304, 305 of floating gate memory cells is coupled to a source line 306 by a source select gate 316, 317 and to an individual bit line (BL1-BLN) by a drain select gate 312, 313. The source select gates 316, 317 are controlled by a source select gate control line SG(S) 318 coupled to their control gates. The drain select gates 312, 313 are controlled by a drain select gate control line SG(D) 314.

During a typical prior art programming operation, the selected word line for the flash memory cell to be programmed is biased at a fixed voltage around 6V and the drain is biased with a series of incrementing voltage programming pulses that start at an initial voltage that is greater than a predetermined programming voltage (e.g., approximately 6V). After each programming pulse, a verification operation with a bit or data line voltage of 0.2V to 1.2V is performed to determine if the cell's threshold voltage $V_t$ has increased by the properly programmed level (e.g., 0.5V).

The unselected word lines for the remaining cells are typically biased at a voltage that is greater than the programming word line voltage (e.g., approximately 12V) during the program operation. In one embodiment, the unselected bit or data line voltages can be ground potential. Each of the memory cells is programmed in a substantially similar fashion.

Figure 4:
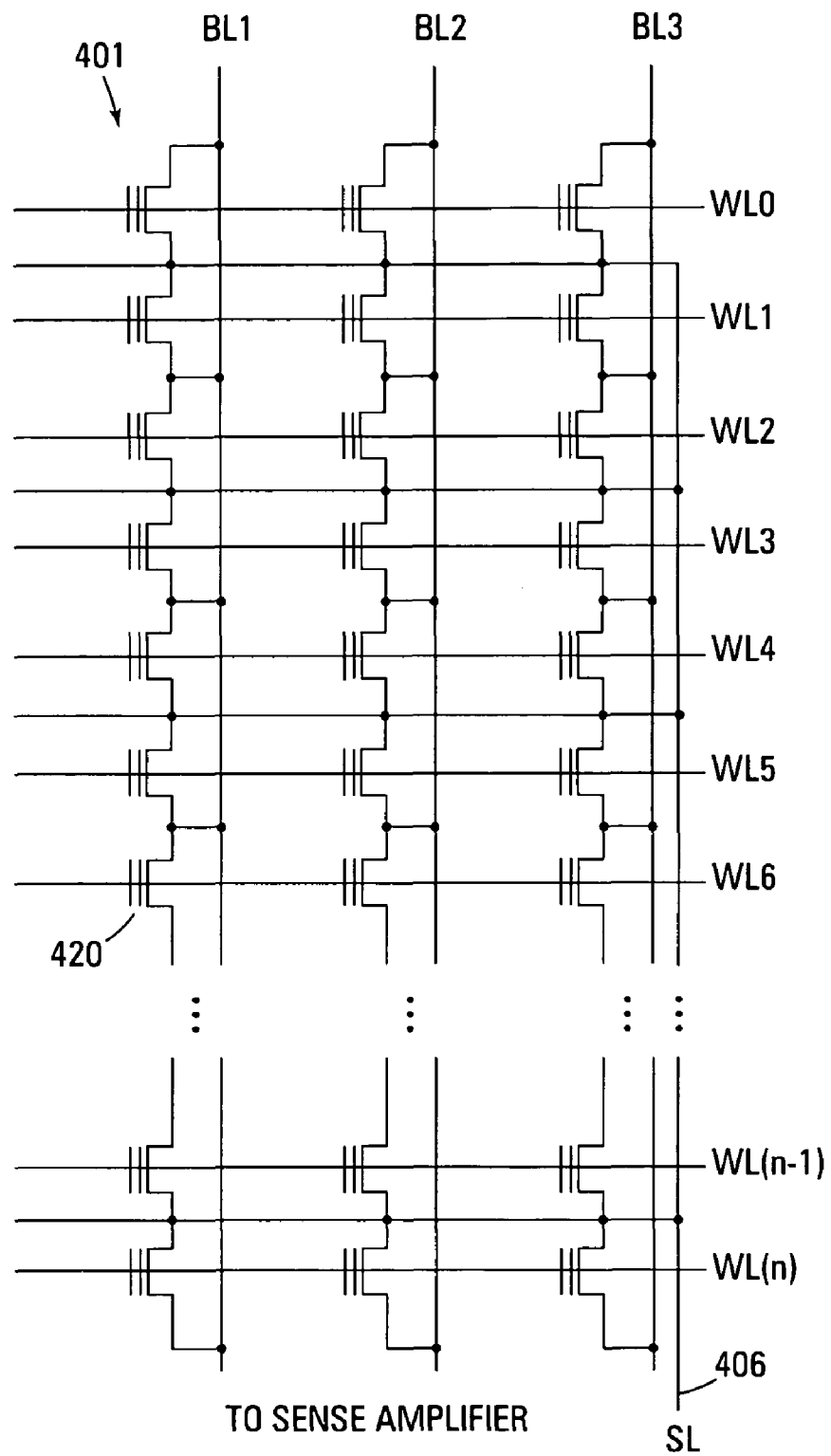
FIG. 4 shows an electrical schematic diagram of a portion of one embodiment of a NOR flash memory array incorporating the memory cells in accordance with FIG. 2.

FIG. 4 illustrates one embodiment of a NOR architecture flash memory array incorporating the flash memory device in accordance with the embodiment of FIG. 2. The memory array is comprised of an array 401 of non-volatile memory cells 420. Each cell 420 is comprised of a drain connection, a source connection, and a control gate as illustrated in FIG. 2 and discussed previously.

In the NOR array architecture, the memory cells of the memory array are arranged in a matrix. The control gate of each memory cell 420 of the array matrix 401 is connected by rows to word select lines (word lines WL0-WLn) and their drains are connected to column bit lines, BL1-BL3. The source of each memory cell 420 is typically connected to a common source line SL 406.

The NOR architecture memory array 401 is accessed by a row decoder activating a row of floating gate memory cells by selecting the word line connected to their gates. The row of selected memory cells then place their stored data values on the column bit lines by flowing a differing current if in a programmed state or an erased state from the connected source line to the connected column bit lines.

The bit lines are coupled to sense amplifiers in order to read the cells. The desired cells are turned on for programming, as well as reading, in response to a voltage on the word line. The sense amplifier operation is well known in the art and is not discussed further.

The NOR memory array of FIG. 4 is for purposes of illustration only. For purposes of clarity, an entire memory array cannot be shown since it can be comprised of millions of memory cells.

During a typical programming operation, a voltage of approximately 6V is applied to the appropriate word line. The bit or data line of the selected row typically has incrementing voltage pulses starting around 6V applied to turn on the appropriate transistor to be programmed. Unselected word lines are held at ground potential during the programming operation.

During a typical prior art program verify operation, a voltage in the range of 0.2-1.2V is applied to the bit line. The selected word line has a voltage of approximately 6V applied and the unselected word lines are again held at ground potential. This couples the selected cells to the sense amplifiers for reading/verifying the programmed status of the cells.

Figure 5:
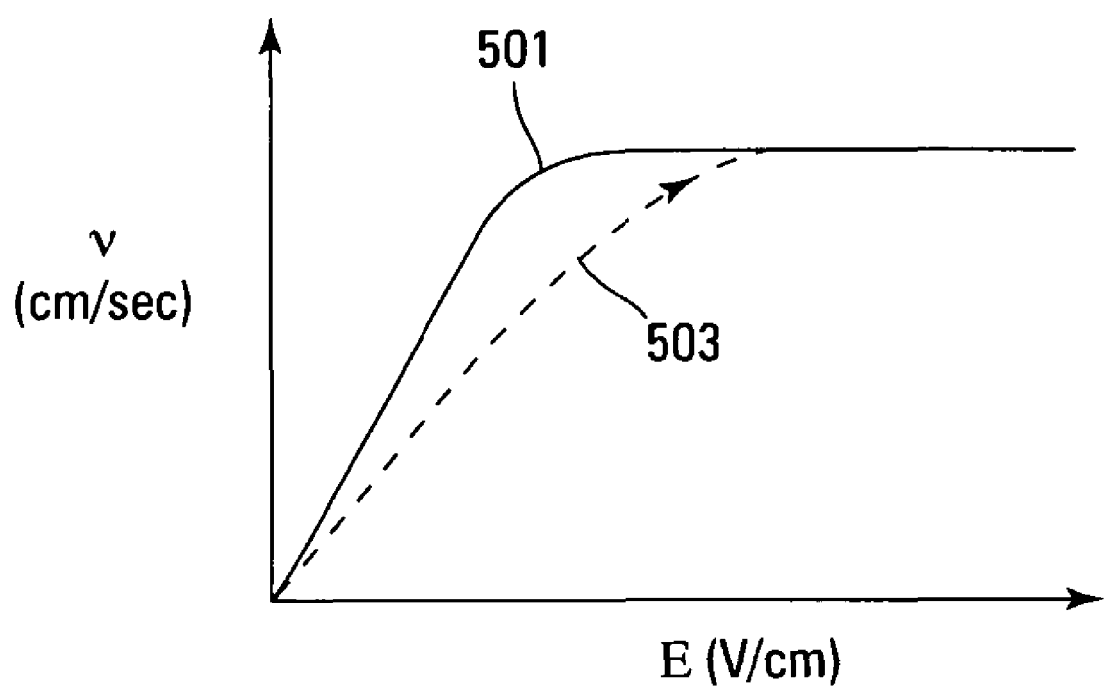
FIG. 5 shows a plot of the effect of the improved mobility on electron mobility in accordance with the tensile strained memory cell of the present invention.

FIG. 5 illustrates a plot of the electric field (x-axis) generated in the transistor channel versus the drain voltage (y-axis) required to produce that field. The solid line 501 shows the voltage versus electrical field curve of the NMOSFET of the present invention with the tensile strained silicon layer. The dotted line 503 shows the voltage versus electrical field of an NMOSFET without the tensile strained silicon layer. These plots show that the tensile strained silicon layer provides lower drain voltages and lower electric fields, thus providing improved channel hot electron efficiency.

Figure 6:
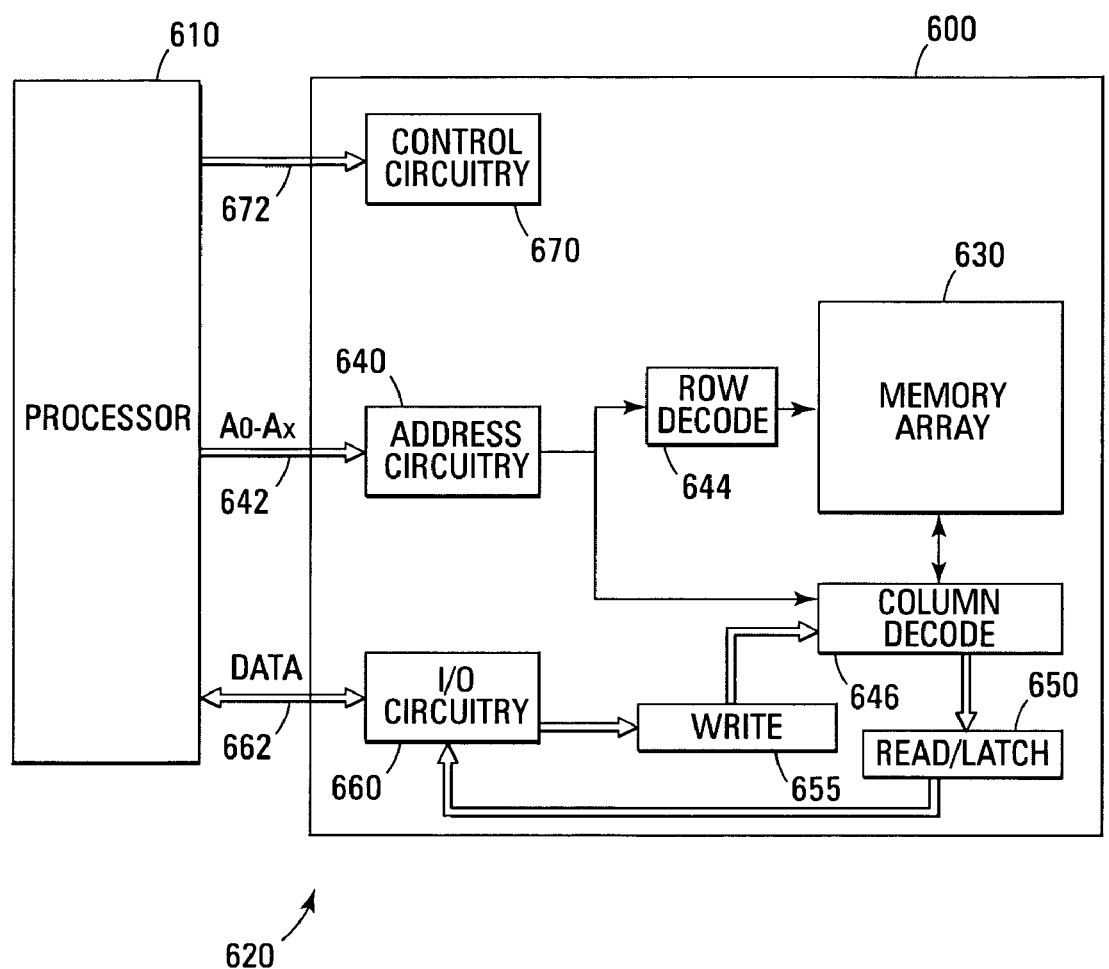
FIG. 6 shows a block diagram of an electronic system of the present invention incorporating the tensile strained memory cells of the present invention.

FIG. 6 illustrates a functional block diagram of a memory device 600 that can incorporate the memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of non-volatile memory cells 630 that can be NROM cells, flash memory cells, or other types of non-volatile semiconductor cells. The memory array 630 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture. The memory cells of the present invention can be arranged in either a NAND or NOR architecture, as described previously, as well as other architectures.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense amplifier/buffer circuitry 650. The sense amplifier/buffer circuitry, in one embodiment, is coupled to read and latch a row of data from the memory array 630. Data input and output buffer circuitry 660 is included for bidirectional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller.

The flash memory device illustrated in FIG. 6 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 7:
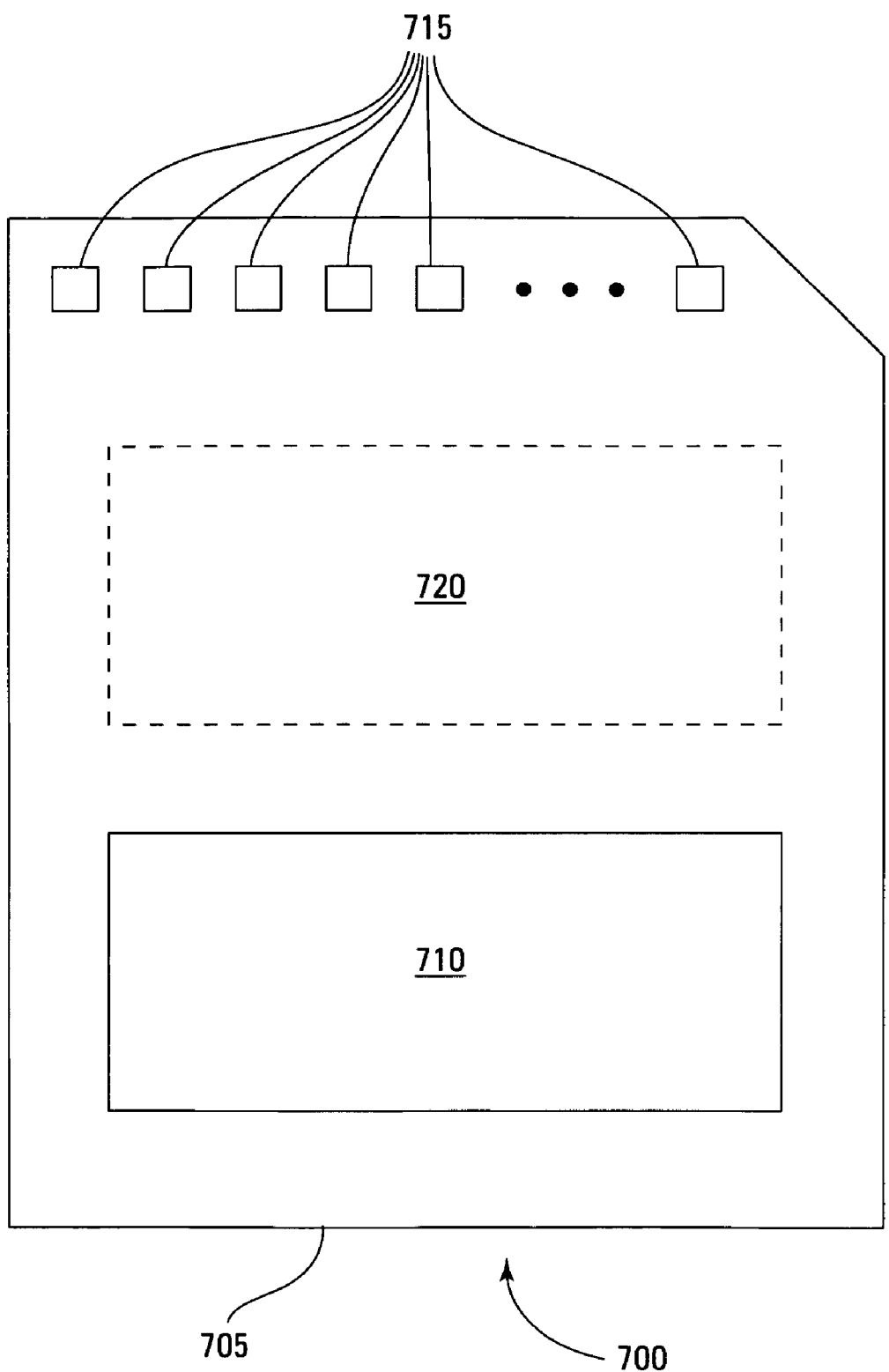
FIG. 7 shows a block diagram of a memory module of the present invention.

FIG. 7 is an illustration of a memory module 700. Although memory module 700 is illustrated as a memory card, the concepts discussed with reference to memory module 700 are applicable to other types of removable or portable memory, e.g., USB flash drives. In addition, although one example form factor is depicted in FIG. 7, these concepts are applicable to other form factors as well.

Memory module 700 includes a housing 705 to enclose one or more memory devices 710. At least one memory device 710 is comprised of memory cells having the tensile stressed silicon layer of the present invention. The housing 705 includes one or more contacts 715 for communication with a host device. Examples of host devices include digital cameras, digital recording and playback devices, PDAs, personal computers, memory card readers, interface hubs and the like. For some embodiment, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on COMPACTFLASH™ memory cards licensed by SanDisk Corporation, MEMORYSTICK™ memory cards licensed by Sony Corporation, SD SECURE DIGITAL™ memory cards licensed by Toshiba Corporation and the like. In general, however, contacts 715 provide an interface for passing control, address and/or data signals between the memory module 100 and a host having compatible receptors for the contacts 715.

The memory module 700 may optionally include additional circuitry 720. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 100 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710. The additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

In summary, a strained silicon nitride capping layer is formed over a flash or NROM device to improve the mobility and efficiency of channel hot electron injection. The mobility enhancement results in improved write efficiency, improved read efficiency, and reduced access times in the memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory cell comprising:
   a substrate having a pair of doped source/drain regions;
   a tunnel dielectric formed over the substrate and substantially between the pair of source/drain regions;
   a charge storage gate formed over the tunnel dielectric;
   an inter-gate dielectric formed over the charge storage gate;
   a control gate formed over the inter-gate dielectric; and
   a biaxially stressed silicon nitride formed over and in contact with the control gate.

2. The memory cell of claim 1 wherein the substrate is p-type silicon and the source/drain regions are doped n+ regions.

3. The memory cell of claim 1 wherein the control gate is comprised of polysilicon.

4. The memory cell of claim 1 wherein the charge storage gate is comprised of polysilicon.

5. The memory cell of claim 1 wherein the tunnel dielectric and the inter-gate dielectric are comprised of silicon dioxide.

6. The memory cell of claim 1 wherein the non-volatile memory cell is an NROM cell.

7. The memory cell of claim 1 wherein the non-volatile memory cell is a flash memory cell.

8. A memory array comprising:
   a plurality of memory cells formed in column and row directions in a substrate, each cell comprising:
      a source region and a drain region doped into the substrate;

a tunnel dielectric formed over the substrate and substantially between the source and drain regions;
a charge storage gate formed over the tunnel dielectric;
an inter-gate dielectric formed over the charge storage gate;
a control gate formed over the inter-gate dielectric; and
a biaxially stressed silicon nitride formed over and in contact with the control gate such that the silicon nitride is coupled to adjacent memory cells in a predetermined direction of the array.

9. The array of claim 8 wherein the plurality of memory cells are flash memory cells and the charge storage gate is comprised of polysilicon.

10. The array of claim 8 wherein the plurality of memory cells are NROM cells and the charge storage gate is comprised of silicon nitride.

11. The array of claim 8 wherein the stressed silicon nitride is coupled to adjacent memory cells only in the row direction in a NOR architecture.

12. The array of claim 8 wherein the stressed silicon nitride is coupled to adjacent memory cells only in the column direction in a NAND architecture.

13. A semiconductor, non-volatile memory device comprising:
a memory array comprising a plurality of memory cells formed in column and row directions in a substrate, each cell comprising:
a source region and a drain region doped into the substrate;
a tunnel dielectric formed over the substrate and substantially between the source and drain regions;
a charge storage gate formed over the tunnel dielectric;
an inter-gate dielectric formed over the charge storage gate;
a polysilicon control gate formed over the inter-gate dielectric; and
a biaxially stressed silicon nitride formed over and in contact with the polysilicon control gate such that the silicon nitride is coupled to adjacent memory cells in a predetermined direction of the array.

14. The memory device of claim 13 wherein the plurality of memory cells are either NROM cells or flash memory cells in response to a composition of the charge storage gate.

15. The memory device of claim 13 wherein the control gate of each memory cell of the array in a row direction is coupled to a word line.

16. An electronic system comprising:
a processor that generates memory control signals; and
a non-volatile memory cell device coupled to the processor and comprising a plurality of memory cells coupled together through word lines and bit lines, each cell comprising:
a source region and a drain region doped into the substrate;
a tunnel dielectric formed over the substrate and substantially between the source and drain regions;
a charge storage gate formed over the tunnel dielectric;
an inter-gate dielectric formed over the charge storage gate;
a control gate formed over the inter-gate dielectric; and
a biaxially stressed silicon nitride formed over and in contact with the control gate such that the silicon nitride is coupled to adjacent memory cells in a predetermined direction of the array.

17. A memory module comprising:
semiconductor, non-volatile memory device comprising:
a memory array comprising a plurality of memory cells formed in column and row directions in a substrate, each cell comprising:
a source region and a drain region doped into the substrate;
a tunnel dielectric formed over the substrate and substantially between the source and drain regions;
a charge storage layer formed over the tunnel dielectric;
an inter-gate dielectric formed over the charge storage layer;
a control gate formed over the inter-gate dielectric; and
a biaxially stressed silicon nitride formed over and in contact with the control gate such that the silicon nitride is coupled to adjacent memory cells in a predetermined direction of the array; and
a plurality of contacts configured to provide selective contact between the memory device and a host system.

18. The module of claim 17 and further including a memory controller coupled to the memory device for controlling operation of the memory device in response to the host system.

19. A method for fabricating a non-volatile memory cell, the method comprising:
doping predetermined areas of a substrate to form a pair of source/drain regions;
forming a tunnel dielectric layer over the substrate and substantially between the pair of source/drain regions;
forming a charge storage layer over the tunnel dielectric layer;
forming an inter-gate dielectric layer over the charge storage layer;
forming a control gate over the inter-gate dielectric layer; and
forming biaxially strained silicon nitride over and in contact with the control gate.

20. The method of claim 19 wherein forming the strained silicon nitride capping layer comprises depositing the layer using reactive plasma deposition.

21. A method for fabricating a memory array, the method comprising:
fabricating a plurality of memory cells in column and row directions in a substrate, fabricating each cell comprises:
doping a source region and a drain region into the substrate;
forming a tunnel dielectric over the substrate and substantially between the source and drain regions;
forming a charge storage layer over the tunnel dielectric;
forming an inter-gate dielectric over the charge storage layer;
forming a polysilicon control gate over the inter-gate dielectric; and
forming biaxially strained silicon nitride over the polysilicon control gate such that the silicon nitride is coupled to adjacent memory cells in a predetermined direction of the array.

22. The method of claim 21 wherein doping the source and drain regions comprises doping n+ regions into a p-type substrate.

23. The method of claim 21 wherein the predetermined direction is the row direction.

24. The method of claim 21 wherein the predetermined direction is the column direction.

25. The method of claim 21 wherein forming the charge storage layer includes forming a nitride charge storage layer.

26. The method of claim 21 wherein forming the charge storage layer includes forming a floating gate.

* * * * *